(12) United States Patent
Bruening et al.

(10) Patent No.: US 12,175,811 B2
(45) Date of Patent: Dec. 24, 2024

(54) METHOD AND DEVICE FOR MONITORING OPERATION OF AT LEAST ONE ELECTRICAL LOAD FOR A VEHICLE

(71) Applicant: Robert Bosch GmbH, Stuttgart (DE)

(72) Inventors: Silke Bruening, Schwieberdingen (DE); Adrian Haug, Leonberg (DE); Christoph Senneka, Remchingen (DE); Dieter Bruss, Aidlingen (DE); Manuela Niekisch, Gechingen (DE); Martin Karle, Leinfelden-Echterdingen (DE); Philipp Brechel, Stuttgart (DE); Thomas Tietjen, Muensigen/Trailfingen (DE); Wei Ling, Renningen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 237 days.

(21) Appl. No.: 17/886,507

(22) Filed: Aug. 12, 2022

(65) Prior Publication Data

US 2023/0046995 A1    Feb. 16, 2023

(30) Foreign Application Priority Data

Aug. 16, 2021   (DE) ..................... 10 2021 208 954.2

(51) Int. Cl.
*G07C 5/08*         (2006.01)
(52) U.S. Cl.
CPC ......... *G07C 5/0808* (2013.01); *G07C 5/0816* (2013.01)

(58) Field of Classification Search
CPC ................ G07C 5/0808; G07C 5/0816; G01R 19/16595; G01R 31/007
See application file for complete search history.

(56) References Cited

U.S. PATENT DOCUMENTS

2002/0047690 A1\* 4/2002 Okamoto .................. H02P 9/04
                                                      322/14
2016/0344178 A1\* 11/2016 Wortberg ............. G01R 31/007

FOREIGN PATENT DOCUMENTS

DE      102013018294 B4    1/2020
DE      102022116489 A1 \*  1/2024 ............ H02M 3/335

\* cited by examiner

*Primary Examiner* — Brian P Sweeney
(74) *Attorney, Agent, or Firm* — NORTON ROSE FULBRIGHT US LLP; Gerard A. Messina

(57) ABSTRACT

A method for monitoring operation of at least one electrical load for a vehicle. A comparison of an actual value of an operating parameter with four threshold values is performed. A monitoring signal is also generated dependent on a result of the comparison, the monitoring signal being generated with a first signal characteristic if the actual value lies between the first threshold value and the third threshold value or between the second threshold value and the fourth threshold value, or being generated with a second signal characteristic if the actual value lies above the third threshold value or below the fourth threshold value. The first signal characteristic effects activation of at least one safety function that maintains an active operating state of the at least one electrical load. The second signal characteristic effects deactivation of the at least one electrical load.

9 Claims, 2 Drawing Sheets

METHOD AND DEVICE FOR MONITORING OPERATION OF AT LEAST ONE ELECTRICAL LOAD FOR A VEHICLE

CROSS REFERENCE

The present application claims the benefit under 35 U.S.C. § 119 of German Patent Application No. DE 10 2021 208 954.2 filed on Aug. 16, 2021, which is expressly incorporated herein by reference in its entirety.

FIELD

The present invention relates to a device and a method for monitoring operation of at least one electrical load for a vehicle. The subject of the present invention is also a computer program.

BACKGROUND INFORMATION

Conventionally, for example voltage monitoring systems for power supply lines on control units can monitor a voltage against an upper and a lower limit and trigger a reaction, e.g., switching off a voltage regulator or resetting the load that is to be supplied, as soon as one of these limits is exceeded. The voltage may be monitored for example using analog comparators or intelligent IC modules.

SUMMARY

A method, a device using this method, and a corresponding computer program, are provided according to the present invention. The measures disclosed herein enable advantageous developments and improvements of the basic device and method disclosed herein.

According to specific example embodiments of the present invention, in particular for monitoring operation of an electrical load or multiple electrical loads, a comparison of a parameter that is relevant to operation with four threshold values or limit values can be performed. In such case, for example in the event of a lesser deviation of the parameter from a standard value or set value, an operation-ready state of the at least one electrical load can be maintained and merely a safety function carried out, with the at least one electrical load being able to be switched off or reset only in the event of a greater deviation. In particular a pair of inner limit values and a pair of outer limit values around the standard value or set value can be used for this purpose.

In particular by monitoring the operating parameter against two upper and two lower limits or threshold values, availability of the at least one electrical load can be increased relative to monitoring against only one upper and only one lower limit. Upon an inner limit being exceeded, a reaction may take place without resetting or switching off the load. As a result, a loss of time due to for example initialization when starting up the load again can be avoided. This increases availability. Potential faulty operations of the at least one electrical load in phases in which the operating parameter exceeds or undershoots an inner limit can thus be prevented. Any exceeding or undershooting of the inner parameter limits may be limited timewise to times in the millisecond range or below. The at least one electrical load is then switched off in particular only when the outer limits are exceeded or undershot, which protects an electrical load from damage.

In contrast to parameter monitoring in which a parameter that is to be monitored is monitored against merely one upper and merely one lower limit, in accordance with specific embodiments in particular availability of the at least one load that is to be monitored can be increased by the monitoring taking place against two upper and two lower limits with a threshold logic. Thus a conventional situation in which the parameter that is to be monitored has its set value between merely one upper and merely one lower limit can also be avoided, the upper and lower limits being selected such that the parameter that is to be monitored remains in the range specified by the load, or normal operation is completely interrupted upon exceeding/undershooting a limit, so that faulty operating modes cannot occur. Instead, according to specific embodiments, not only can availability of the at least one monitored electrical load be increased, but also the at least one electrical load, e.g. a microcontroller, can maintain the parameter in the specified range in order reliably to achieve fault-free operation of the load.

A method for monitoring operation of at least one electrical load for a vehicle is provided. According to an example embodiment of the present invention, the method comprises the following steps:

performing a comparison of an actual value of an operating parameter, representing a physical variable, of the at least one electrical load with four threshold values related to a set value of the operating parameter, with a first threshold value representing a first positive deviation from the set value, with a second threshold value representing a first negative deviation from the set value, with a third threshold value representing a second positive deviation from the set value that is greater than the first positive deviation, with a fourth threshold value representing a second negative deviation from the set value that is greater than the first negative deviation; and generating a monitoring signal for outputting to an interface with the at least one electrical load and/or with a control unit of the vehicle dependent on a result of the comparison, with the monitoring signal being generated with a first signal characteristic if the actual value lies between the first threshold value and the third threshold value or between the second threshold value and the fourth threshold value, or being generated with a second signal characteristic if the actual value lies above the third threshold value or below the fourth threshold value, the first signal characteristic effecting activation of at least one safety function that maintains an active operating state of the at least one electrical load, the second signal characteristic effecting deactivation of the at least one electrical load.

The electrical load may be configured as a control unit. In particular, the electrical load may be configured as a central control unit for driving assistance and autonomous or highly automated driving. The set value may also be referred to as a standard value. The operating parameter may represent a physical variable that is necessary for the operation of the at least one electrical load and additionally or alternatively is critical or relevant with regard to operating safety. The step of performing may be carried out continuously, and additionally or alternatively repeatedly. The method may also comprise a step of reading in the actual value of the operating parameter from an interface with a detection means, a control unit or the like. If the actual value lies between the first threshold value and the second threshold value, the step of generating may be skipped or missed out. The activation of the safety function may leave the active operating state of the at least one electrical load unaffected. The deactivation of the at least one electrical load means that said load can be transferred into a deactivated operating state. The deactivation of the at least one electrical load may be achieved by switching off and additionally or alternatively resetting the operating parameter, in particular electrical energy.

According to one specific example embodiment of the present invention, the first signal characteristic of the monitoring signal generated in the step of generating as a safety function may effect issuing of a warning message, suppression or marking of at least one output signal of the at least one electrical load as invalid, and/or additionally or alternatively transferring of at least one output of the at least one electrical load into a safe state. The warning message may be output via a communication interface of the electrical load. A specific embodiment of this kind offers the advantage that availability of the at least one electrical load can be increased, it also being possible to reduce a risk of the third threshold value or the fourth threshold value being exceeded.

Also, in the step of performing, threshold values, in which the first positive deviation and the first negative deviation differ from each other in terms of absolute value, and/or additionally or alternatively to this the second positive deviation and the second negative deviation differ from each other in terms of absolute value, may be used. A specific embodiment of this kind offers the advantage that individual specifications of the at least one monitored electrical load can be taken into account precisely and safely.

Further, in the step of performing, the first threshold value and the second threshold value may be defined as limit values for fault-free operation of the at least one electrical load, and additionally or alternatively to this the third threshold value and the fourth threshold value may be defined as limit values for a beginning of a faulty operation or of destruction of the at least one electrical load. A specific embodiment of this kind offers the advantage that the availability of the at least one electrical load can be increased, it also being possible to maintain or even increase operating safety at/to a high level.

In this case, each of the threshold values used in the step of performing may be defined as a limit value of that electrical load of a plurality of monitored electrical loads that is least tolerant for the respective deviation. In such case, the method may be able to be carried out in order to monitor the operation of a plurality of electrical loads. A specific embodiment of this kind offers the advantage that when monitoring multiple electrical loads those specifications with the narrowest operating limits can be considered, to enable safe and reliable operation of all the monitored electrical loads.

In particular, the operation of at least one electrical load that comprises at least one electronic module, a microcontroller, a system on a chip, a field programmable gate array, an application-specific integrated circuit, a memory chip and additionally or alternatively other complex integrated circuit can be monitored. A specific embodiment of this kind offers the advantage that sensitive and costly components can be protected and treated carefully.

In addition, in the step of performing, an operating parameter that represents an electric voltage, an electric current, a temperature or other physical parameter can be used. In particular, in this case the operating parameter may be an electrical parameter into which the physical parameter can be converted. A specific embodiment of this kind offers the advantage that critical parameters for the operation of the at least one electrical load can be monitored depending on the application.

According to example embodiments of the present invention, this method may be implemented for example in software or hardware or in a hybrid form of software and hardware, for example in a device or a control unit.

The present invention further provides a device that is configured to perform, actuate or implement the steps of a variant of a method presented here in corresponding devices. The object underlying the present invention can be achieved rapidly and efficiently by this variant example embodiment of the present invention in the form of a device as well. The device may be configured as an electronic module with a threshold logic, in particular as a microcontroller, a system on a chip, a field programmable gate array or an application-specific integrated circuit.

For this purpose, the device may comprise at least one processing unit for processing signals or data, at least one memory unit for storing signals or data, at least one interface with a sensor or with an actuator for reading in sensor signals from the sensor or for outputting data signals or control signals to the actuator, and/or at least one communication interface for reading in or outputting data that are embedded in a communication protocol. The processing unit may be for example a signal processor, a microcontroller or the like, the memory unit possibly being a flash memory, an EEPROM or a magnetic memory unit. The communication interface may be configured to read in or output data wirelessly and/or in a wired manner, with a communication interface that can read in or output wire-bound data possibly being able to read in these data for example electrically or optically from a corresponding data transmission line, or output them into a corresponding data transmission line.

A device in the present case may be understood to be an electrical apparatus that processes sensor signals representing actual values of the operating parameter and, dependent thereon, outputs control signals and/or data signals in the form of monitoring signals. The device may have an interface that may be configured as hardware and/or software. In the case of a hardware configuration, the interfaces may for example be part of what is called a system ASIC, which contains widely-varying functions of the device. It is however also possible for the interfaces to be separate integrated switching circuits or to consist at least in part of discrete components. In the case of a software configuration, the interfaces may be software modules that for example are present on a microcontroller in addition to other software modules.

A computer program product or computer program with program code that can be stored on a machine-readable support or storage medium such as a semiconductor memory, a hard disk memory or an optical memory and is used to perform, implement and/or actuate the steps of the method according to one of the specific embodiments described above is also advantageous, in particular if the program product or program is executed on a computer or device.

Example embodiments of the present invention are illustrated in the figures and discussed in greater detail in the following description.

DETAILED DESCRIPTION OF EXAMPLE EMBODIMENTS

Figure 1:
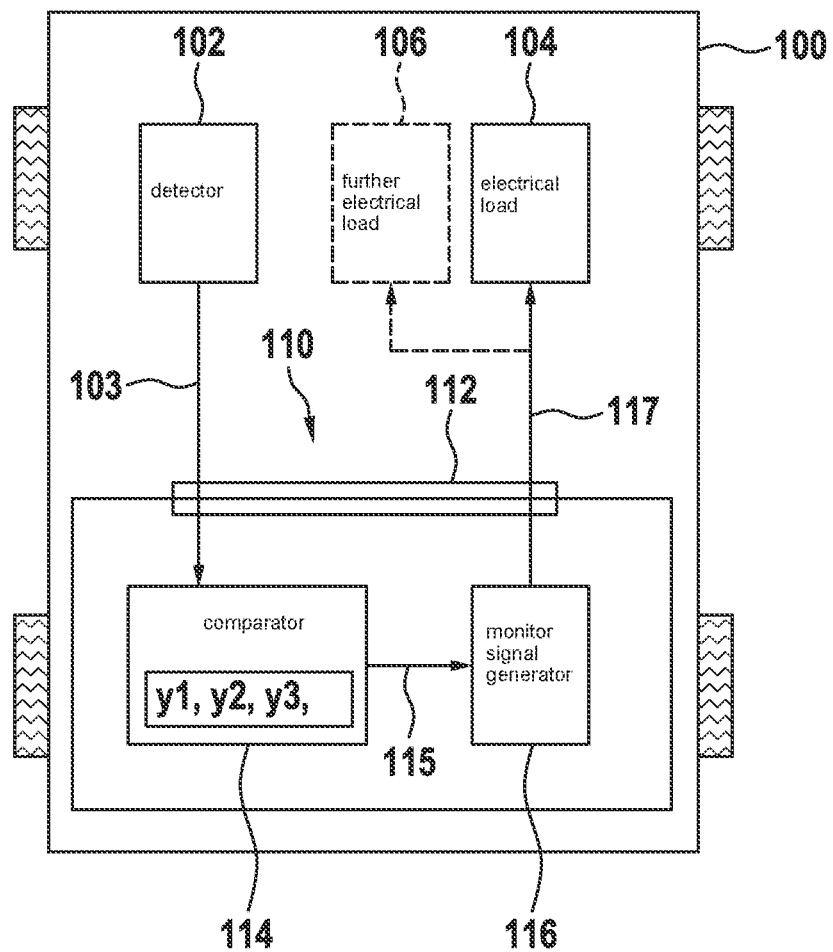
FIG. 1 is a schematic representation of an example embodiment of a device for monitoring operation of at least one electrical load for a vehicle, according to the present invention.

In the following description of beneficial example embodiments of the present invention, identical or similar reference numerals are used for the elements that are illustrated in the various figures and act similarly, a repeated description of these elements being dispensed with.

FIG. 1 shows a schematic representation of an embodiment of a device 110 for monitoring operation of at least one electrical load 104, 106 for a vehicle 100. The vehicle 100 is for example a motor vehicle, such as for example an automobile, truck or other commercial vehicle. Of the vehicle 100, by way of example merely a detection means 102, an electrical load 104, a further electrical load 106 that is optionally additionally provided and the device 110 for monitoring or monitoring device are shown in the illustration of FIG. 1.

The device 110 is configured as an electronic module with a threshold logic, in particular as a microcontroller, a system on a chip (SoC), a field programmable gate array (FPGA) or an application-specific integrated circuit (ASIC). The at least one electrical load 104, 106 comprises, for example, at least one electronic module, a microcontroller, a system on a chip, a field programmable gate array, an application-specific integrated circuit, a memory chip and/or other complex integrated circuit.

The detection means (i.e., detector) 102 is configured to detect an operating parameter of the at least one electrical load 104, 106, this operating parameter representing a physical variable. The detection means 102 is also configured to provide an actual value 103 of the detected operating parameter in signal form. The operating parameter is or represents for example an electric voltage, an electric current, a temperature or other physical parameter. In particular, the operating parameter is an electrical parameter into which the physical parameter is converted based on the measurement method used by detection means 100.

The device 100 is configured to read in the actual value 103 from the detection means 102 via an interface 112. The device 100 further comprises a performance means 114 and a generation means 116. The performance means 114 is configured to perform a comparison of the actual value 103 with four threshold values y1, y2, y3, y4 that are related to a set value of the operating parameter. A first threshold value y1 in such case represents a first positive deviation from the set value. A second threshold value y2 represents a first negative deviation from the set value. A third threshold value y3 represents a second positive deviation from the set value that is greater than the first positive deviation. A fourth threshold value y4 represents a second negative deviation from the set value that is greater than the first negative deviation. The performance means 114 is also configured to pass on a result 115 of the comparison performed to the generation means 116 in signal form. The generation means 116 in turn is configured to generate, dependent on the result 115 of the comparison, a monitoring signal 117 for outputting to the interface 112 with the at least one electrical load 104, 106 and/or with a control unit of the vehicle 100. In this case, the generation means 116 is configured to generate the monitoring signal 117 with a first signal characteristic if the actual value 103 lies between the first threshold value y1 and the third threshold value y3 or between the second threshold value y2 and the fourth threshold value y4. The generation means 116 is also configured to generate the monitoring signal 117 with a second signal characteristic if the actual value 103 lies above the third threshold value y3 or below the fourth threshold value y4. In this case, the first signal characteristic of the monitoring signal 117 effects activation of at least one safety function that maintains an active operating state of the at least one electrical load 104, 106. The second signal characteristic effects deactivation of the at least one electrical load 104, 106.

According to one embodiment, the generation means (i.e., generator) 116 is configured to generate the monitoring signal 117 with a first signal characteristic that as a safety function effects issuing of a warning message, suppression or marking of at least one output signal of the at least one electrical load 104, 106 as invalid and/or transferring of at least one output of the at least one electrical load 104, 106 into a safe state.

According to one embodiment, the performance means 114 is configured to use threshold values y1, y2, y3, y4, in which the first positive deviation and the first negative deviation differ from each other in terms of absolute value and/or the second positive deviation and the second negative deviation differ from each other in terms of absolute value. In particular, according to one embodiment the first threshold value y1 and the second threshold value y2 are defined as limit values for fault-free operation of the at least one electrical load 104, 106. Additionally or alternatively to this, the third threshold value y3 and the fourth threshold value y4 are defined as limit values for a beginning of a faulty operation or of destruction of the at least one electrical load 104, 106. In this case, according to one embodiment each of the threshold values y1, y2, y3, y4 used by the performance means 114 is defined as a limit value of that electrical load 104 or 106 of a plurality of monitored electrical loads 104, 106 that is least tolerant for the respective deviation.

Figure 2:
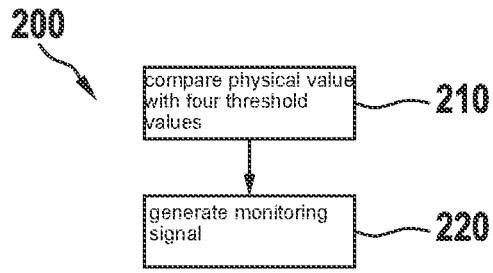
FIG. 2 is a flowchart of an embodiment of a method for monitoring operation of at least one electrical load for a vehicle, according to the present invention.

FIG. 2 is a flowchart of an embodiment of a method 200 for monitoring operation of at least one electrical load for a vehicle. The method 200 for monitoring can be carried out using or with the device of FIG. 1 or a similar device. The method 200 for monitoring comprises a step 210 of performing and a step 220 of generating.

In the step 210 of performing, a comparison of an actual value of an operating parameter, representing a physical variable, of the at least one electrical load with four threshold values related to a set value of the operating parameter is performed. In this case, a first threshold value represents a first positive deviation from the set value, a second threshold value represents a first negative deviation from the set value, a third threshold value represents a second positive deviation from the set value that is greater than the first positive deviation, and a fourth threshold value represents a second negative deviation from the set value that is greater than the first negative deviation.

In the step 220 of generating, dependent on a result of the comparison performed in the step 210 of performing, a monitoring signal for outputting to an interface with the at least one electrical load and/or with a control unit of the vehicle is generated. In this case, the monitoring signal is generated with a first signal characteristic if the actual value lies between the first threshold value and the third threshold value or between the second threshold value and the fourth threshold value. The monitoring signal is generated with a second signal characteristic if the actual value lies above the third threshold value or below the fourth threshold value. The first signal characteristic effects activation of at least one safety function that maintains an active operating state of the at least one electrical load. The second signal characteristic effects deactivation of the at least one electrical load.

Figure 3:
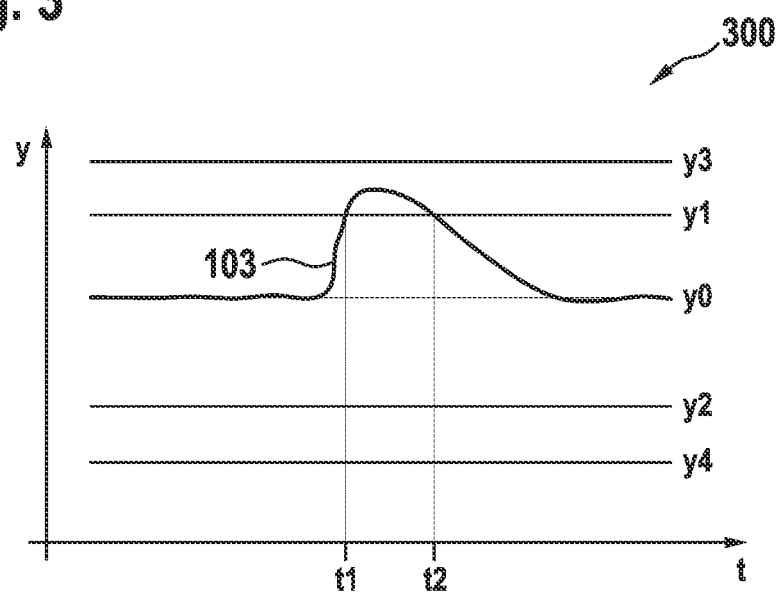
FIG. 3 is a schematic representation of a time characteristic of an operating parameter of at least one electrical load and of threshold values in accordance with one embodiment in a first monitoring situation, according to the present invention.

FIG. 3 shows a schematic representation 300 of a time characteristic of an operating parameter y of at least one electrical load and of threshold values y1, y2, y3, y4 in accordance with one embodiment in a first monitoring situation. The operating parameter y and the threshold values y1, y2, y3, y4 are those described above or similar ones. The representation 300 is to be considered in conjunction with or in connection with the device of FIG. 1 or a similar device and/or with the method of FIG. 2 or a similar method. An operating parameter/time graph is shown, with the time t being plotted on the X-axis and the operating parameter y being plotted on the Y-axis. The operating parameter is an electric voltage, an electric current, a temperature or the like. In addition to the above-mentioned threshold values y1, y2, y3, y4, a set value y0 and the actual value 103 of the operating parameter are also marked in. In the first monitoring situation, the actual value 103 exceeds the first threshold value y1 at a first time t1 and falls below it again at a subsequent second time t2. In such case, the safety function can be triggered by the device and/or the method. Between the first time t1 and the second time t2, the actual value 103 runs between the first threshold value y1 and the third threshold value y3. Before the first time t1 and after the second time t2, the actual value 103 lies between the first threshold value y1 and the second threshold value y2, in particular at the set value y0.

According to the embodiment illustrated here, the first positive deviation between the set value y0 and the first threshold value y1 and the first negative deviation between the set value y0 and the second threshold value y2 differ from each other in terms of absolute value, the first positive deviation being less than the first negative deviation. Further, the second positive deviation between the set value y0 and the third threshold value y3 and the second negative deviation between the set value y0 and the fourth threshold value y4 differ from each other in terms of absolute value, the second positive deviation being less than the second negative deviation. A distance between the first threshold value y1 and the third threshold value y3 and a distance between the second threshold value y2 and the fourth threshold value y4 are by way of example identical.

Figure 4:
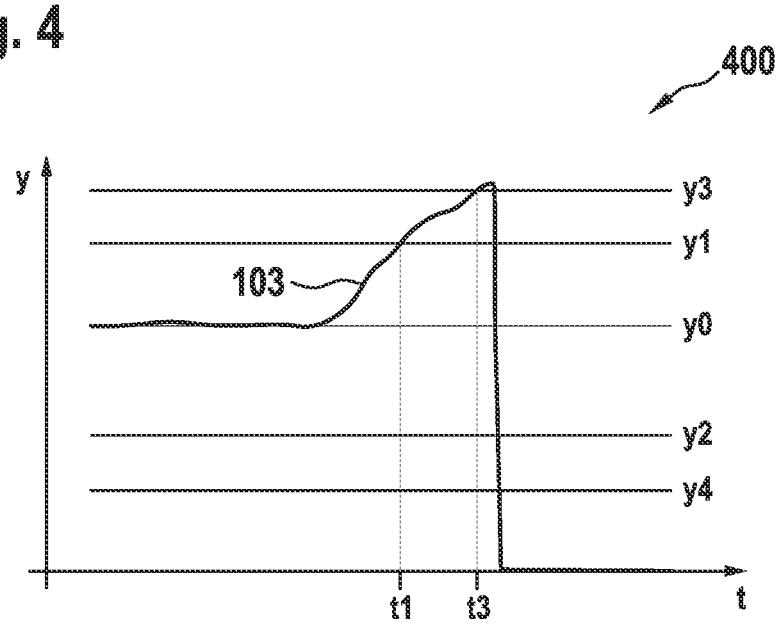
FIG. 4 is a schematic representation of a time characteristic of an operating parameter of at least one electrical load and of threshold values in accordance with one embodiment in a second monitoring situation, according to the present invention.

FIG. 4 is a schematic representation 400 of a time characteristic of an operating parameter of at least one electrical load and of threshold values in accordance with one embodiment in a second monitoring situation. The representation in FIG. 4 corresponds to the representation of FIG. 3, with the exception that in the second monitoring situation the third threshold value y3 is exceeded by the actual value 103 at a third time t3. Responding to this, the at least one electrical load is deactivated by the device and/or the method, which is shown by a drop in the actual value 103 to zero in the representation 400.

With reference to the figures described above, in particular FIG. 3 and FIG. 4, let it be assumed by way of example that the variable that is to be monitored or the operating parameter y is a voltage U, the set value y0 of the voltage being a voltage Unom. The first threshold value y1 or an upper inner voltage limit Uui is greater than the set value y0 or the voltage Unom. The second threshold value y2 or a lower inner voltage limit Uli is lower than the set value y0 or the voltage Unom. The third threshold value y3 or an upper outer voltage limit Uuo is greater than the first threshold value y1 or the upper inner voltage limit Uui. The fourth threshold value y4 or a lower outer voltage limit Ulo is lower than the second threshold value y2 or a lower inner voltage limit Uli. If the actual value 103 of the operating parameter y or of the voltage to be monitored Uact during operation leaves the voltage band of the upper and lower inner voltage limit in the period from the first time t1 up to the second time t2, but not the voltage limit of the upper and lower outer voltage limits, then a safety function or reaction takes place without resetting or switching off the load, as described above, for the period between the first time t1 and the second time t2. Normal operation can [sic] of the at least one electrical load be resumed immediately after the second time t2. It is possible to prevent a time delay and restriction of availability due to starting up the load again from occurring after the second time t2. FIG. 3 or the first monitoring situation shows the upper inner voltage limit being breached. The same would apply analogously to the lower inner voltage limit being breached. If the actual value 103 of the operating parameter y or of the voltage to be monitored Uact during operation leaves the voltage band of the upper and lower outer voltage limits at the third time t3, as a reaction resetting and/or switching off of the load that is to be supplied and/or of the voltage to be monitored is carried out. FIG. 4 or the second monitoring situation shows the upper outer voltage limit being breached. The same would apply analogously to breaching the lower outer voltage limit. What has been described herein applies to all the physical variables that are to be monitored, such as for example an electric current or a temperature. The physical value that is to be monitored may also be converted into an electrical voltage value based on the measurement method.

With reference to the figures described above, below embodiments will be discussed briefly once again in summary and using different words.

According to embodiments, in particular a threshold logic may be provided for, for example, an analog-to-digital converter or the like. The voltage to be monitored and additionally or alternatively another operating parameter y is monitored against two upper and two lower limits or threshold values y1, y2, y3, y4, the monitoring taking place using an intelligent module that has implemented the threshold logic, here the device 110, the inner lower limit and the inner upper limit or the second threshold value y2 and the first threshold value y1 being determined by the specified voltage limits of the load 104, 106 that is to be supplied, within which voltage limits fault-free operation is guaranteed, and a reaction without resetting and switching off being caused, such as for example a warning message via a communication interface of the control device, suppression and/or marking invalid of signals leaving the control unit, the entering of the outputs of the control device into a safe state, etc., the outer lower limit and the outer upper limit or the fourth threshold value y4 and the third threshold value y3 being determined by the destruction limits of the load 104, 106 that is to be supplied, and the intelligent module or the device 110 triggering a reaction, such as switching off or resetting of the load 104, 106 that is to be supplied, so that the load 104, 106 that is to be supplied cannot be damaged.

Optionally, the variable that is to be monitored or the operating parameter y comprises other physical monitoring values, such as for example a current value or temperature value. The physical value may be converted, based on the measurement method, into an electrical voltage. According to one embodiment, with the electrical voltage to be monitored or using the operating parameter y, multiple loads 104, 106 are supplied, with the inner and outer lower limits depending on the load 104 or 106 with the highest limit value and the inner and outer upper limits depending on the load 104 or 106 with the lowest limit value. For example, the electronic modules that are to be monitored or the electrical loads 104, 106 in such case are microcontrollers, SoCs (systems on a chip), FPGAs (field programmable gate arrays), ASICs (application-specific integrated circuits), memory chips or other complex integrated circuits. The device 110 or the monitoring module with the threshold logic is for example configured as a microcontroller, SoC, FPGA or ASIC.

If an embodiment comprises an "and/or" link between a first feature and a second feature, this is to be read as the embodiment according to one specific embodiment comprising both the first feature and the second feature, and according to a further embodiment comprising either only the first feature or only the second feature.

What is claimed is:

1. A method for monitoring operation of at least one electrical load for a vehicle, the method comprising:
    performing, via a comparator, a comparison of an actual value of an operating parameter, representing a physical variable, of the at least one electrical load with four threshold values related to a set value of the operating parameter, a first threshold value of the four threshold values representing a first positive deviation from the set value, a second threshold value of the four threshold values representing a first negative deviation from the set value, a third threshold value of the four threshold values representing a second positive deviation from the set value that is greater than the first positive deviation, and a fourth threshold value of the four threshold values representing a second negative deviation from the set value that is greater than the first negative deviation;
    generating, via a monitor signal generator, a monitoring signal, dependent on a result of the comparing, based on (i) a first signal characteristic when the actual value lies between the first threshold value and the third threshold value or between the second threshold value and the fourth threshold value, and (ii) a second signal characteristic when the actual value lies above the third threshold value or below the fourth threshold value;
    outputting the monitoring signal to an interface with the at least one electrical load and/or with a control unit of the vehicle; and
    activating, using the first signal characteristic, at least one safety function of the vehicle that maintains an active operating state of the at least one electrical load, and deactivating, using the second signal characteristic, the at least one electrical load of the vehicle.

2. The method as recited in claim 1, wherein, the first signal characteristic of the monitoring signal generated in the step of generating as the safety function effects issuing of a warning message, and/or suppression or marking of at least one output signal of the at least one electrical load as invalid, and/or transferring of at least one output of the at least one electrical load into a safe state.

3. The method as recited in claim 1, wherein, in the step of performing: the first positive deviation and the first negative deviation differ from each other in terms of absolute value, and/or the second positive deviation and the second negative deviation differ from each other in terms of absolute value.

4. The method as recited in claim 1, wherein, in the step of performing, the first threshold value and the second threshold value are defined as limit values for fault-free operation of the at least one electrical load, and/or the third threshold value and the fourth threshold value are defined as limit values for a beginning of a faulty operation or of destruction of the at least one electrical load.

5. The method as recited in claim 4, wherein each of the four threshold values used in the step of performing is defined as a limit value of that electrical load of a plurality of monitored electrical loads that is least tolerant for the respective deviation.

6. The method as recited in claim 1, wherein the at least one electrical load includes at least one electronic module, and/or a microcontroller, and/or a system on a chip, and/or a field programmable gate array, and/or an application-specific integrated circuit, and/or a memory chip and/or other complex integrated circuit.

7. The method as recited in claim 1, wherein in step of performing, the operating parameter represents an electric voltage or an electric current or a temperature or another physical parameter, the operating parameter being an electrical parameter into which the physical parameter is converted.

8. An apparatus to monitor operation of at least one electrical load for a vehicle, comprising:
    a device configured to perform the following:
        performing, via a comparator, a comparison of an actual value of an operating parameter, representing a physical variable, of the at least one electrical load with four threshold values related to a set value of the operating parameter, a first threshold value of the four threshold values representing a first positive deviation from the set value, a second threshold value of the four threshold values representing a first negative deviation from the set value, a third threshold value of the four threshold values representing a second positive deviation from the set value that is greater than the first positive deviation, and a fourth threshold value of the four threshold values representing a second negative deviation from the set value that is greater than the first negative deviation;
        generating, via a monitor signal generator, a monitoring signal, dependent on a result of the comparing, based on (i) a first signal characteristic when the actual value lies between the first threshold value and the third threshold value or between the second threshold value and the fourth threshold value, and (ii) a second signal characteristic when the actual value lies above the third threshold value or below the fourth threshold value;
        outputting the monitoring signal to an interface with the at least one electrical load and/or with a control unit of the vehicle; and
        activating, using the first signal characteristic, at least one safety function of the vehicle that maintains an active operating state of the at least one electrical load, and deactivating, using the second signal characteristic, the at least one electrical load of the vehicle.

9. A non-transitory machine-readable storage medium, on which is stored a computer program, which is executable by a processor, comprising:
- a program code arrangement having program code for monitoring operation of at least one electrical load for a vehicle, by performing the following:
  - performing, via a comparator, a comparison of an actual value of an operating parameter, representing a physical variable, of the at least one electrical load with four threshold values related to a set value of the operating parameter, a first threshold value of the four threshold values representing a first positive deviation from the set value, a second threshold value of the four threshold values representing a first negative deviation from the set value, a third threshold value of the four threshold values representing a second positive deviation from the set value that is greater than the first positive deviation, and a fourth threshold value of the four threshold values representing a second negative deviation from the set value that is greater than the first negative deviation;
  - generating, via a monitor signal generator, a monitoring signal, dependent on a result of the comparing, based on (i) a first signal characteristic when the actual value lies between the first threshold value and the third threshold value or between the second threshold value and the fourth threshold value, and (ii) a second signal characteristic when the actual value lies above the third threshold value or below the fourth threshold value;
  - outputting the monitoring signal to an interface with the at least one electrical load and/or with a control unit of the vehicle; and
  - activating, using the first signal characteristic, at least one safety function of the vehicle that maintains an active operating state of the at least one electrical load, and deactivating, using the second signal characteristic, the at least one electrical load of the vehicle.

* * * * *